United States Patent [19]

Tran et al.

[11] Patent Number: 4,618,947
[45] Date of Patent: Oct. 21, 1986

[54] DYNAMIC MEMORY WITH IMPROVED ADDRESS COUNTER FOR SERIAL MODES

[75] Inventors: Bao G. Tran, Houston; Joseph H. Neal, Missouri City; Lionel S. White, Houston, all of Tex.

[73] Assignee: Texas Instruments Incorporated, Dallas, Tex.

[21] Appl. No.: 634,901

[22] Filed: Jul. 26, 1984

[51] Int. Cl.[4] .............................................. G11C 8/00
[52] U.S. Cl. .................................... 365/230; 365/189
[58] Field of Search ........................ 365/189, 230, 233

[56] References Cited

U.S. PATENT DOCUMENTS

4,072,932  2/1978  Kitagawa et al. .................. 365/233

*Primary Examiner*—Joseph A. Popek
*Attorney, Agent, or Firm*—John G. Graham

[57] ABSTRACT

A semiconductor dynamic read/write memory device has serial data input/output modes, such as the so-called nibble, byte or extended nibble modes. This device employs improved address counter circuitry to access data from a selected row. An initial column address is latched when a serial mode is initiated, and the counter steps through the programmed number of bits, starting at the initial address. The number of bits used in the serial mode may be selected by metal-mask programming. To avoid a speed penalty, look-ahead circuitry initiates the set up for serial mode before the controls for this mode are detected.

18 Claims, 11 Drawing Figures

DYNAMIC MEMORY WITH IMPROVED ADDRESS COUNTER FOR SERIAL MODES

RELATED CASES

This application discloses subject matter also disclosed in copending applications Ser. No. 626,791, filed July 2, 1984; Ser. No. 630,507 filed July 11, 1984; Ser. No. 634,898, filed July 26, 1984; Ser. No. 636,941, filed Aug. 2, 1984; Ser. No. 640,716, filed Aug. 14, 1984; and Ser. No. 640,717, filed Aug. 14, 1984; all assigned to Texas Instruments.

BACKGROUND OF THE INVENTION

This invention relates to semiconductor memory devices, and more particularly to data input/output circuits for dynamic memory devices having serial I/O modes.

Dynamic MOS read/write memory devices have been constructed generally as shown in U.S. Pat. No. 4,081,701 (a 16K dynamic RAM) issued to White, McAdams and Redwine, or U.S. Pat. No. 4,293,993 (a 64K dynamic RAM) issued to McAlexander, White and Rao, both assigned to Texas Instruments. In these prior devices the data input/output was of the single-bit format. In U.S. Pat. No. 4,330,852 issued to Redwine, White and Rao, also assigned to Texas Instruments, a dynamic RAM is shown which provides both random access and serial access capability for data I/O.

The manufacture of memory devices is much more economical if a single chip design is produced in high volume rather than smaller numbers of several different designs. However, several different types of data I/O capabilities for DRAMs are required by various customers. Examples of these are nibble mode (4-bit serial), byte mode (8-bit serial), extended nibble, etc. Each of these would require different I/O circuitry, and thus a different chip design.

It is the principal object of this invention to provide improved data input/output circuitry for high density dynamic RAM devices, particularly for serial data I/O modes. Another object is to provide data input/output circuitry for a CMOS dynamic RAM in which the operating mode may be changed by relatively simple changes at a late stage in the manufacturing process. A further object is to provide serial data I/O circuitry which is of high speed and low power dissipation.

SUMMARY OF THE INVENTION

In accordance with one embodiment of the invention, a semiconductor dynamic read/write memory device has serial data input/output modes, such as the so-called nibble, byte or extended nibble modes. This device employs improved address counter circuitry to access data from a selected row. An initial column address is latched when a serial mode is initiated, and the counter steps through the programmed number of bits, starting at the initial address. The number of bits used in the serial mode may be selected by metal-mask programming. To avoid a speed penalty, look-ahead circuitry initiates the set up for serial mode before the controls for this mode are detected.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1a is a timing diagram illustrating the operation of the device of FIG. 1;

DETAILED DESCRIPTION OF THE SPECIFIC EMBODIMENT

Figure 1:
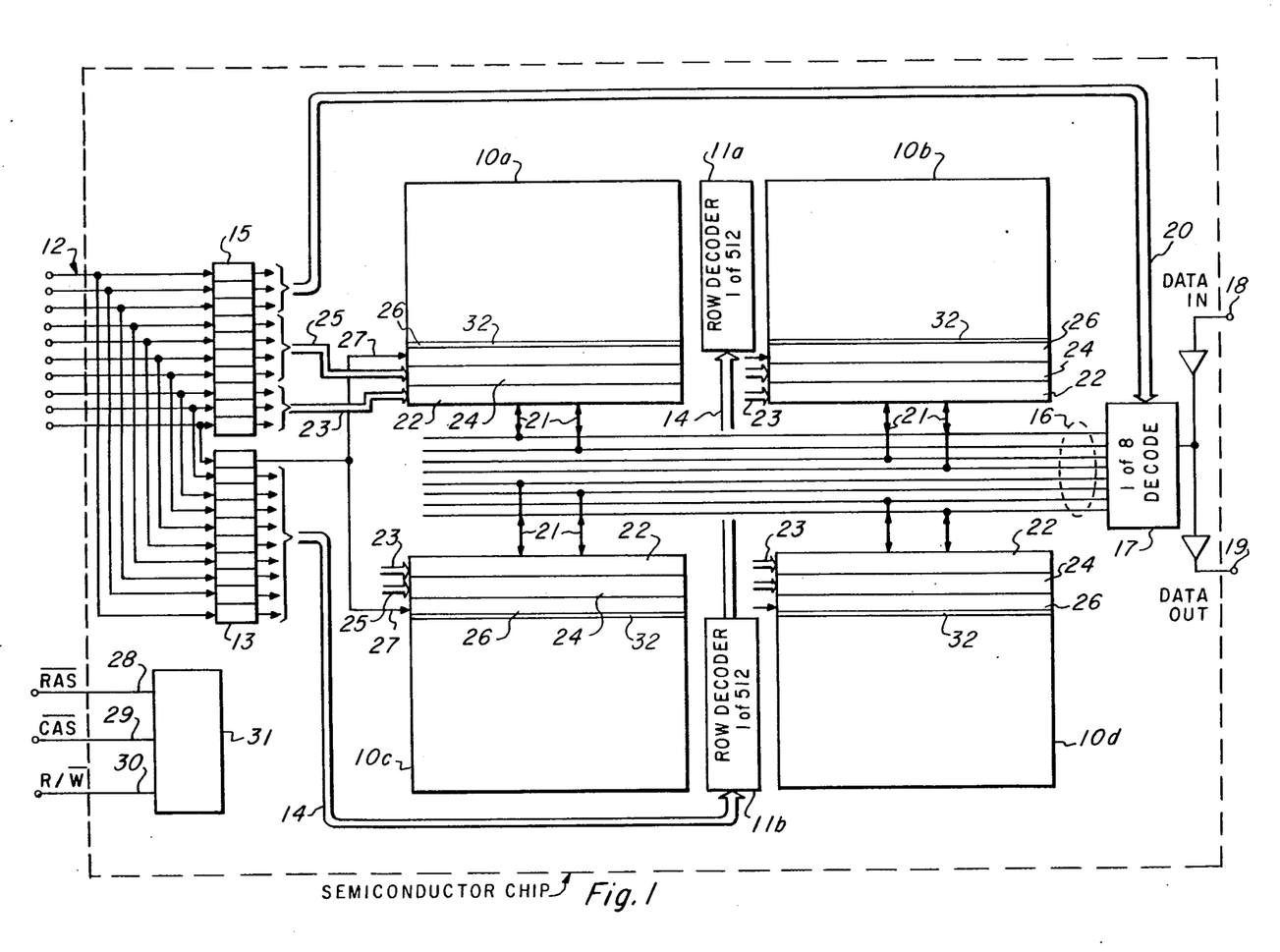
FIG. 1 is an electrical diagram in block form of a dynamic memory device of the 1-Megabit size which may use the serial data I/O circuitry including the address counter of the invention.

Referring to FIG. 1, a block diagram of one example of a semiconductor read/write memory chip which may use serial data I/O circuitry constructed according to the invention is illustrated. This device is of the so-called 1-Megabit size, having $2^{20}$ or 1,048,576 memory cells in an array of rows and columns. The array is partitioned into four identical blocks 10a, 10b, 10c and 10d, with each block containing 262,144 cells. Within each block, there are 512 row lines, and all row lines are connected to one of the row decoders 11a or 11b. Each row decoder 11a or 11b receives 9-bits of a 10-bit row address from address input pins 12 by way of row address latches 13 and lines 14. A 10-bit column address is also applied to the input pins 12, in time-multiplexed manner, and this column address is coupled to buffers 15 which, according to the invention, contain the counter for serial I/O functions, as will be explained. Eight data I/O lines 16 are positioned in the center of the array, and one of these eight is selected for data input or output by a 1-of-eight selector 17; a single I/O line from this selector 17 is connected through buffers to the data-in pin 18 and the data-out pin 19. The selector 17 receives three bits of the column address by lines 20 from the column address buffers 15. Two of the eight lines 16 are connected respectively to each of the blocks 10a, 10b, 10c and 10d by I/O lines 21. A 2-of-16 column selection is made in sixteen first-level intermediate output buffers 22 for each block, using three bits of the column address on lines 23 from buffers 15. A 1-of-16 column selection is made in each of sixteen sets of sixteen second-level intermediate output buffers 24 in each block 10a–10d, using four bits of the column address on lines 25 from buffers 15. Each one of 512 sense amplifiers 26 in each block is connected to one of the columns in the array (each column is made up of two column line halves or "bit lines"). Each buffer 24 is coupled to one of two columns; this selection is based on a one bit of the row address from buffers 13 on line 27.

The memory device receives a row address strobe $\overline{RAS}$ on input pin 28, and a column address strobe $\overline{CAS}$ on input pin 29. Selection of a read or a write operation is made by a $R/\overline{W}$ control on an input pin 30. A clock generator and control circuit 31 produces all of the internal clocks and controls as needed. For a single-bit read (or write), $\overline{RAS}$ and $\overline{CAS}$ drop to zero in sequence as illustrated in FIG. 1a, and a one-bit data read (or write) occurs. To initiate a serial mode, however, the $\overline{CAS}$ voltage is toggled, to access multiple data bits as shown. According to the invention, the address counter in buffer 15 is set up for a serial mode after the first time $\overline{CAS}$ drops, even though it is not then known if it will be a serial-mode operation.

Each block of the array contains two rows of dummy cells 32 in the usual manner, as discussed in the above-mentioned U.S. Pat. Nos. 4,293,993 or 4,081,701.

Figure 2:
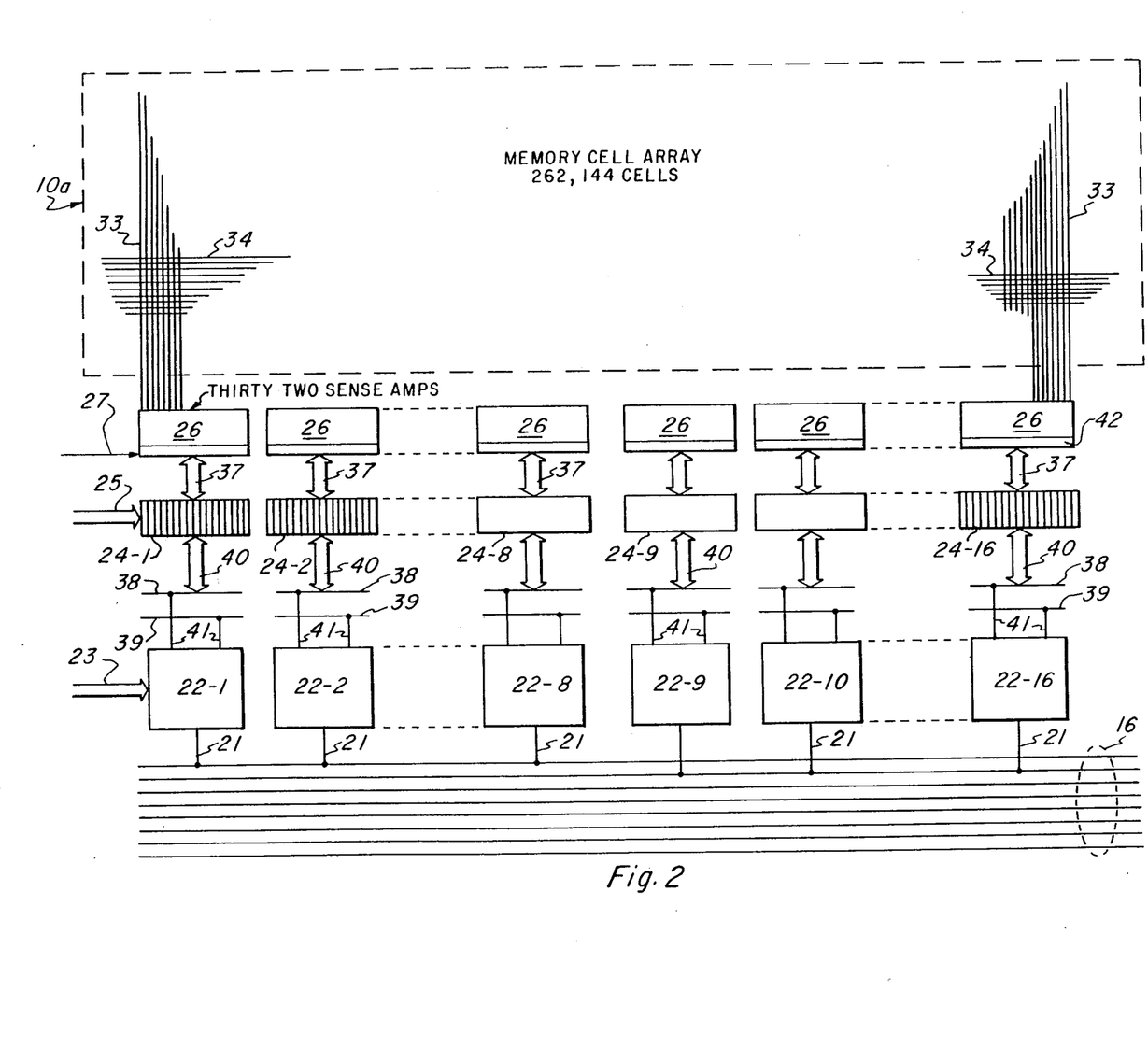
FIG. 2 is an electrical diagram in block form of a part of the memory device of FIG. 1.

Referring to FIG. 2, the I/O lines 16, the intermediate output buffers 22 and 24, and the sense amplifiers 26 are shown in more detail for a part of one of the blocks 10a–10d. In a given block, there are sixteen of the intermediate output buffers 22, in this figure labelled 22-1 . . . 22-16. Note that buffers 22-1 through 22-8 are in one group of eight associated with one of the lines 16 for this block, and the buffers 22-9 through 22-16 are in another group of eight connected with the other one of the lines 16 for this block by lines 21. For each one of the buffers 22-1 . . . 22-16, there is a set of sixteen buffers 24; here these sets are labelled 24-1 through 24-16 (sixteen in each set). For each set of sixteen buffers 24, a group of thirty-two sense amplifiers 26 is provided, and each sense amplifier 26 is connected to two of the bit lines 33 (one column equals two bit lines, or two column line halves). Intersecting the bit lines 33 are 512 row lines 34 in the memory cell array. The dummy row lines 32 also intercept the bit lines 33, as will be described. One of the two dummy lines is selected by the row decoder 11a, 11b using one bit of the nine-bit row address 14.

The tenth bit of the row address from buffers 13 is applied by the line 27 to a multiplex circuit for the sense amplifiers 26 to select which one of the two sense amplifiers of each pair is connected to the respective buffer 24 by lines 37. There are sixteen pairs of data/data-bar lines 38 and 39 in this block, each pair being coupled to the selected buffers 24 on one side by lines 40 and connected to the selected buffers 22 on the other side by lines 41. Note that the I/O changes from double rail at the lines 38 and 39 to single rail at the data I/O lines 16, for a write operation.

Figure 3:
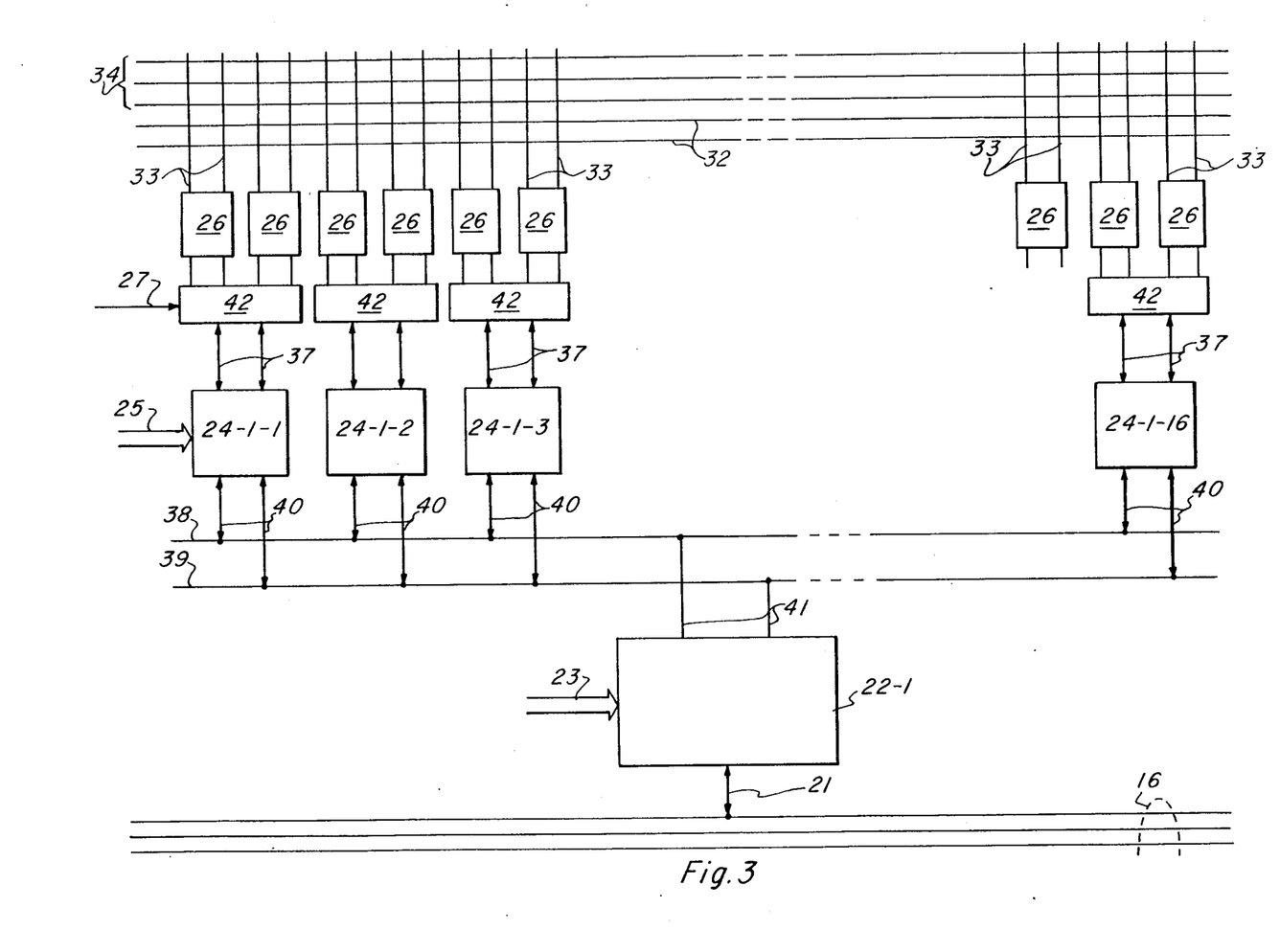
FIG. 3 is an electrical diagram in block form of a part of the circuitry of FIG. 2.

Referring to FIG. 3, a part of the circuitry of FIG. 2 is shown in more detail. The sense amplifiers 26 associated with the set of sixteen buffers 24-1 are shown. There are actually thirty-two sense amps 26 for this set. This set of sixteen buffers 24-1 is labelled 24-1-1 through 24-1-16 in this figure. Each individual sense amplifier 26 has two bit lines 33 extending from it, in the so-called folded bit line configuration. Thus, both dummy rows 32 are on the same side of the sense amp. The row lines 34 intersect the bit lines, and memory cells are at intersections of row lines and bit lines. A multiplexer 42 for each pair of sense amplifiers 26 selects one, based on the address bit on line 27, for connection to the respective buffer 24-1-1, 24-1-2, etc., by lines 37. Only one of the sixteen buffers 24-1-1 through 24-1-16 is selected at any one time, based on the four column address bits on lines 25, so only one will be operative to couple a read-or-write bit of data to or from the lines 38, 39 by lines 40. The buffer 22-1 of FIG. 3 may or may not be selected by the 2-of-16 select provided by three bits on lines 23, for coupling the dual-rail I/O lines 38, 39 to the single rail I/O line 16 for this group.

Figure 4:
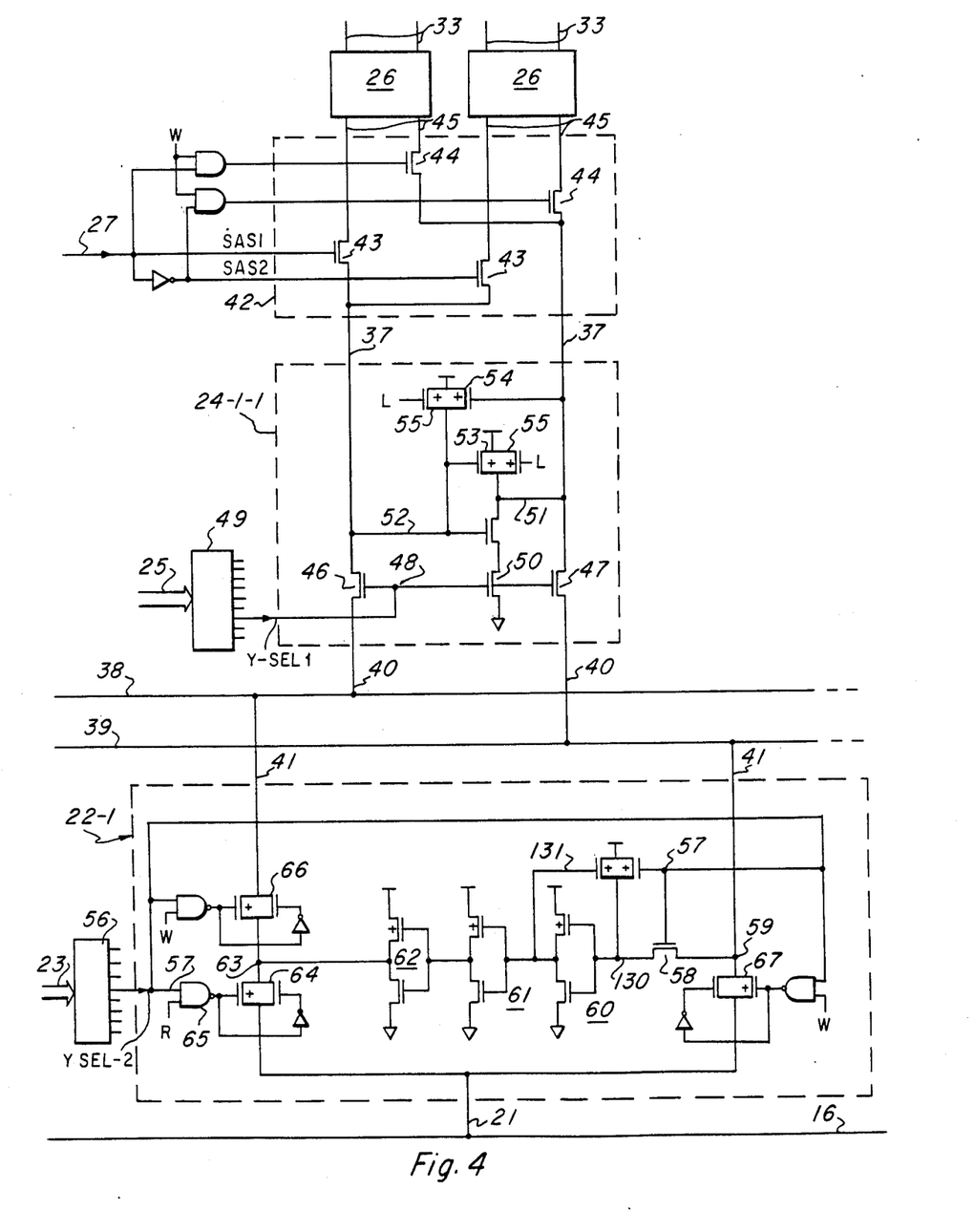
FIG. 4 is an electrical diagram in schematic form of the multiplexers, buffers and column selector circuits of the device of FIG. 3.

Turning now to FIG. 4, a detailed schematic diagram is shown for one of the buffers 24, e.g., the buffer 24-1-1 of FIG. 3, and for one of the buffers 22, e.g., the buffer 22-1. This arrangement of intermediate I/O buffers is the subject of copending application Ser. No. 626,791, filed July 2, 1984, by Poteet & Chang, assigned to Texas Instruments. The multiplexer 42 consists of four transistors; one of the two transistors 43 is selected by the address bit on line 27 and its complement, i.e., by the sense-amp-select signals SAS1 and SAS2, so only one of these transistors 43 is on during a read (or write) operation. For read, only one path exists, through the selected one of the transistors 43. For write, one of the transistors 44 is also turned on by the address bit 27 which is Anded with a write control W from the control circuitry 31, valid when the $R/\overline{W}$ control 30 is in the write condition. Thus, the lines 45 which are inputs or outputs of the sense amplifiers 26 are single-ended for read and dual-rail for write; that is, for read operations both of the transistors 44 are off, and only one of the transistors 43 is on, whereas for write operations one transistor 43 and its associated transistor 44 are conductive. The input/output lines 37 for the multiplexer 42 are connected through source/drain paths of transistors 46 and 47 in the buffer 24-1-1 to the lines 38 and 39. The transistors 46 and 47 are controlled by Y-select information on node 48, which comes from a 1-of-16 decoder 49 receiving the 4-bit column address on lines 25. A transistor 50 also is controlled by the Y-select on node 48; this transistor 50 is in series with an inverter transistor which has a P-channel precharge and load circuit. In the single-ended read operation, the inverter functions to place on node 51 the complement of the data bit on node 52, when the buffer 24-1-1 is selected (due to node 48 being high and transistor 50 being on), so the data bit from the selected sense amp is coupled from node 51, through transistor 47, line 39, to node 59 of the buffer 22-1. Transistor 46 and line 38 have no function during read operations. When node 52 is low, P-channel transistor 53 is on and node 51 is held at the supply voltage Vdd. Likewise, when node 51 is low, P-channel transistor 54 is held on and node 52 is held high. Both nodes 51 and 52 are precharged high by P-channel transistors 55 which receive a low-going precharge voltage L (generated by the circuitry 31) in the precharge cycle after $\overline{RAS}$ goes high.

The buffer 22-1 in FIG. 4 is controlled by Y-select information from address bits on lines 23 and a 2-of-16 decoder 56, so if this buffer is selected a node 57 is high. This condition turns on a tranistor 58 and allows the data on line 39 or node 59 to be amplified through three stages 60, 61 and 62 for driving a node 63. For read, a complementary transistor pair 64 is on, due to a read command R from control circuitry 31 applied to NAND gate 65. That is, when $R/\overline{W}$ is high, defining a read operation, then R is high and transistors 64 are both on. At this time, complementary transistors pairs 66 and 67 are off because write control W is low. Thus, the data bit on line 39 controls the line 16 through node 59, cascaded inverters 60, 61 and 62, node 63 and transistors 64, for a read operation. On the other hand, for a write operation, the transistor pairs 66 and 67 will be on, and transistor pair 64 will be off, so node 59 (and line 39)

will receive the data bit from line 16 through transistors 67, and node 63 (and line 38) will receive the complement of this bit, thus converting from single-rail (on line 16) to double-rail (on lines 38, 39) during write. From the lines 38, 39, the dual-rail write data is coupled through both transistors 46 and 47, then through a selected transistor pair 43, 44, to one of the sense amps 26.

Figure 5:
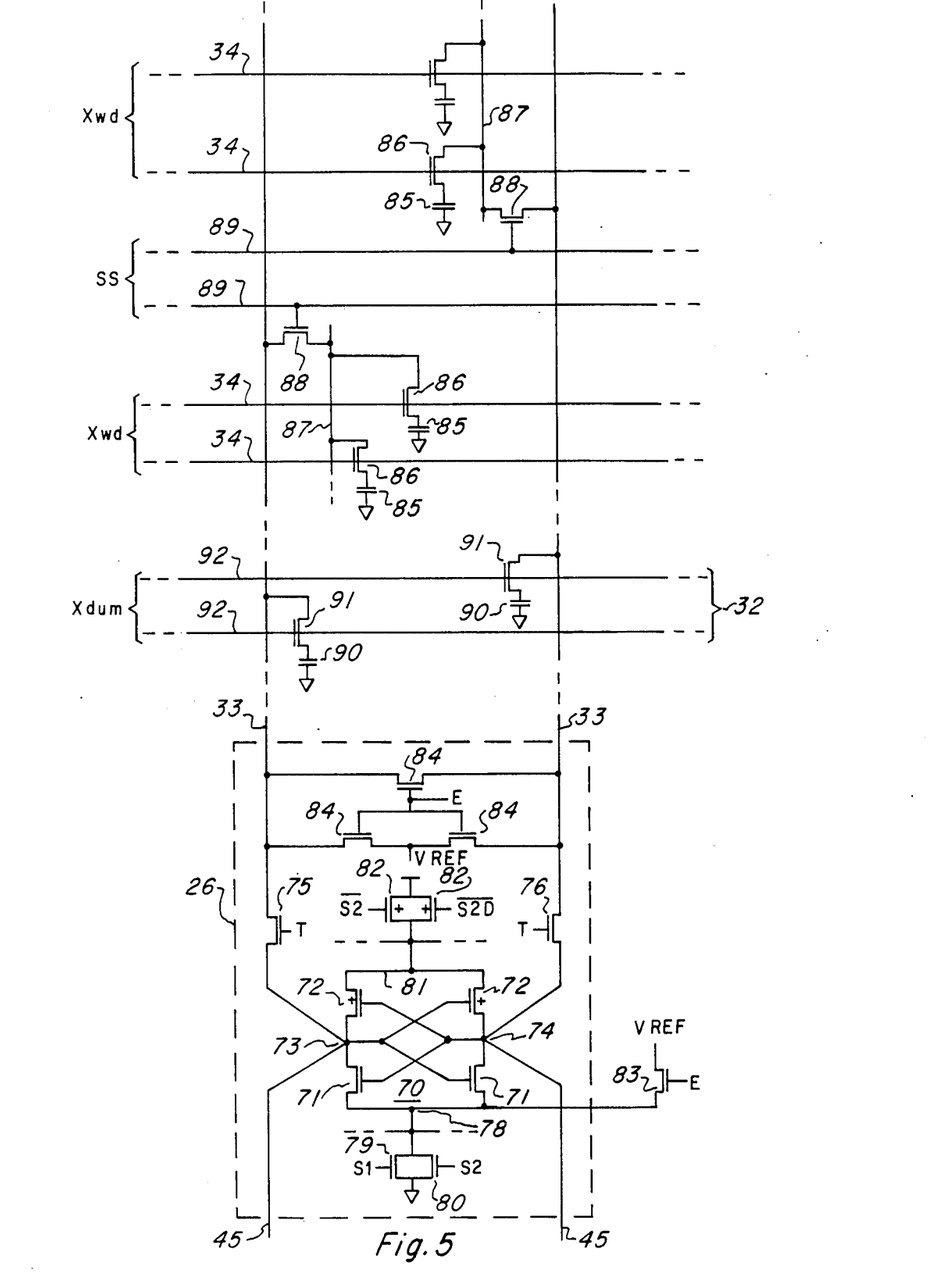
FIG. 5 is an electrical diagram in schematic form of the sense amplifier and cell array of FIGS. 1-4.

Referring to FIG. 5, one of the sense amplifiers 26 is shown in detail. This figure also shows the two bit lines 33 for this sense amplifier and four of the 512 row lines 34 perpendicular to these bit lines. The sense amplifier employs a CMOS cross-coupled flip-flop 70 having N-channel driver transistors 71 and P-channel transistors 72. Sense nodes 73 and 74 are connected to bit lines 33 through the source-drain paths of isolating transistors 75 and 76, as explained in copending application Ser. No. 636,938 or 636,939, filed Aug. 2, 1984, by Duvvury and Hyslop, assigned to Texas Instruments. A node 78 on the ground side of the flip-flop 70 is coupled to ground through two N-channel transistors 79 and 80 which have sense clocks S1 and S2 on their gates. The transistor 79 is much smaller than the transistor 80, and clock S1 occurs first, so the initial sensing is at a lower-gain condition, and is performed by N-channel transistors 71. On the Vdd side, a node 81 is coupled to the supply through P-channel transistors 82, one of which has sense clock $\overline{S2}$ on its gate and the other a delayed $\overline{S2D}$ on its gate. The sense clock $\overline{S2}$ is the complement of S2, so the P-channel transistor 72 starts to operate only when the second clock S2 is activated. There is a two-inverval sense operation, first S1, then S2 and $\overline{S2}$. The transistor pairs 79,80 and the transistors 82, are shared with all of the other sense amplifiers 26 in two blocks 10a and 10b, i.e., 1024 sense amplifiers. The node 78 is precharged to about one-half Vdd by a transistor 83 when E is high.

The bit lines 33 are precharged and equalized through three transistors 84 which have an equalized clock voltage E on their gates; two of these transistors 84 have their source connected to a reference voltage Vref. The value of this reference voltage is about half Vdd, so little or no net charge is needed from the chip supply Vdd to precharge all of the bit lines. That is, one line 33 will be high and the outer low for each sense amplifier, so one will charge the other, and Vref need only supply any differential that might have occurred. The clock E is generated in the control circuitry 31 after the end of an active cycle, when $\overline{RAS}$ goes high.

Each of the memory cells consists of a capacitor 85 and an access transistor 86, with the gates of all of the 512 access transistors 86 in a row being connected to a row line 34. Only one row line 34 of the 512 in the block is turned on at any one time, so only one memory cell capacitor 85 is connected to a bit line 33 for a given sense amplifier 26. According to the invention of application Ser. No. 634,898, filed July 26, 1984 by David J. McElroy, assigned to Texas Instruments, in order to reduce the ratio of the bit line capacitance to the value of the storage capacitance 85, a number of bit line segments 87 are employed for each pair of bit lines 33. Only one of these segments 87 is coupled to a bit line 33 at a given time by one of the transistors 88. For example, each segment 87 may have thirty-two cells connected to it, so in the embodiment disclosed herein there must be sixteen of these segments 87 for each sense amplifier ($16 \times 32 = 512$). The row decoder 11a or 11b selects the appropriate one of sixteen lines 89 by a segment select signal SS when this decoder selects 1-of-512 row lines 34, based on certain ones of the same nine address bits from lines 14.

In the dummy rows 32, a pair of dummy cells are provided for each pair of bit lines 33, and these dummy cells consist of dummy capacitors 90 and access transistors 91. When the selected storage cell is on the left-hand bit line 33, then the right-hand dummy cell is selected in the row decoders 11a, 11b by one of the decoder output lines 92, and vice versa, in the usual manner. One bit of the row address is used in the row decoder to select one or the other of these lines 92 of the dummy cell rows 32.

Figure 6:
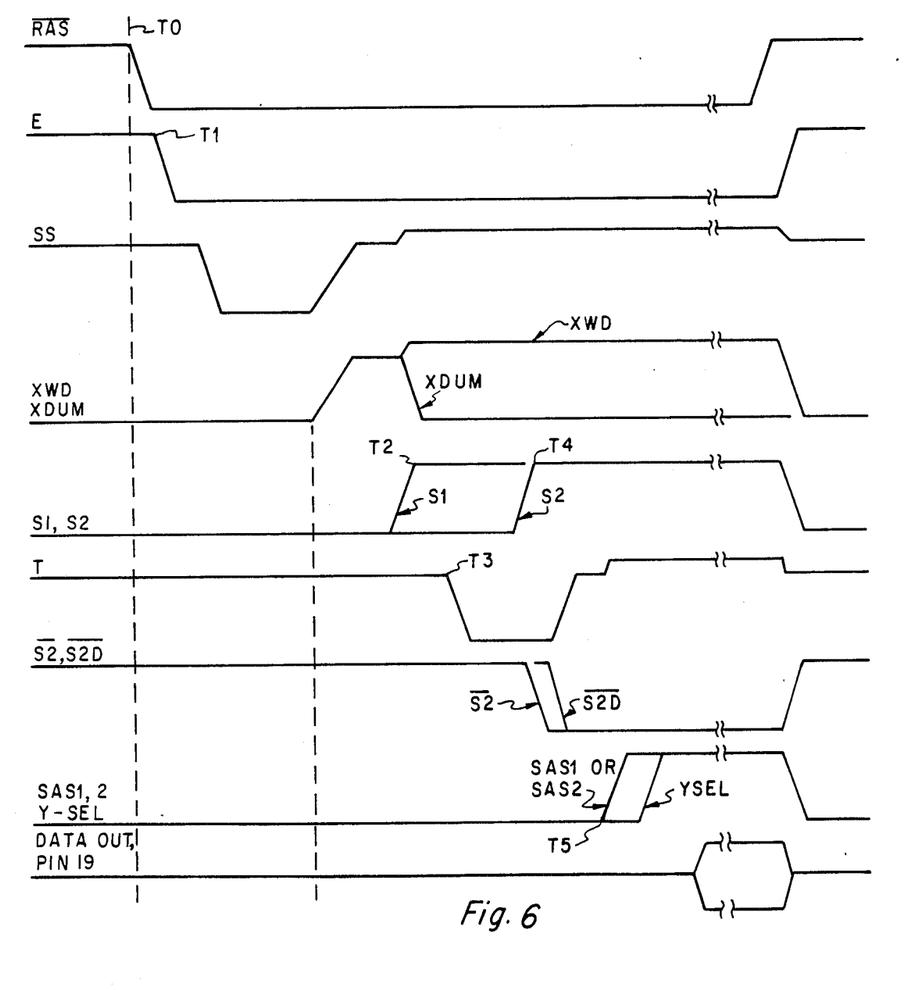
FIG. 6 is a timing diagram showing voltage vs. time for various nodes in the circuit of FIGS. 1-5.

Referring to FIG. 6, the sequence of operation of the memory device will be explained for a single-bit read operation. An active cycle begins with the RAS voltage dropping from +5 to zero at the time T0. This example is a read cycle, so at time T0 the R/$\overline{W}$ input voltage is at +5. The time prior to T0 is a precharge cycle, during which the equalization signal E has been high, so all of the bit lines 33 and the nodes 78, have been precharged to the Vref voltage assumed to be about ½ Vdd or +2.5. The segment select signal SS on all lines 89 is also held high during the precharge cycle, so all of the segments 87 are also precharged to the Vref voltage. The dropping of RAS at T0 causes the equalization signal E to drop at T1, isolating the pairs of bit lines 33 from each other and from Vref. The segment select voltage SS then drops, isolating all of the segments 87 from the bit lines 33. As soon as the row decoders 11a, 11b have had time to respond to the row address, the Xwd and Xdum voltages start to rise on the selected 1-of-512 row line 34 and selected 1-of-2 dummy line 92; at the same time, the segment-select voltage on one of the lines 89 is brought high. These address voltages Xwd, Xdum and SS are brought up rather slowly to the Vdd level; after sensing has been initiated SS and Xwd are boosted above Vdd to eliminate the Vt drop across the access transistors 86 and 88. The Xdum voltage falls at this point, since the function of the dummy cells is completed during initial sensing, and the dummy capacitors can be decoupled from the bit lines so these capacitors can be precharged, as disclosed in copending application Ser. No. 630,507, filed July 22, 1984 by Tran, McAdams and Childers, assigned to Texas Instruments. At time T2, the sense amplifiers 26 are first activated by the S1 voltage going high, turning on the high-impendence N-channel transistor 79; this begins to separate the bit lines 33 further than the separation caused by the differential voltages on the storage cell and dummy cell. But before any current flows from the supply Vdd through transistors 72, the T voltage falls at T3, isolating the bit lines 33 from the sense nodes 73 and 74. After the T voltage falls, the sense voltage S2 is brought up, so the large transistor 80 begins to conduct; also $\overline{S2}$ drops, so one P-channel load transistor 82 begins to conduct. After a slight delay $\overline{S2D}$ falls, and the other P-channel transistor 82 begins to conduct. After S2 rises and $\overline{S2}$ drops at T4, and T voltage is brought up to Vdd. At time T5 after the isolating transistors 75, 76 have been turned back on, sensing is complete and one bit line 33 is high and the other at zero, so the sense-amp-select voltage SAS1 or SAS2 is turned on, connecting one of the bit lines to the node 52 via lines 45 and 37 of FIG. 4. Just after this the Ysel-1 and Ysel-2 outputs from decoders 49 and 56 are valid at nodes 48 and 57, so the selected data bit becomes valid on the line 16, and shortly thereafter valid on the output pin 19.

Figure 7:
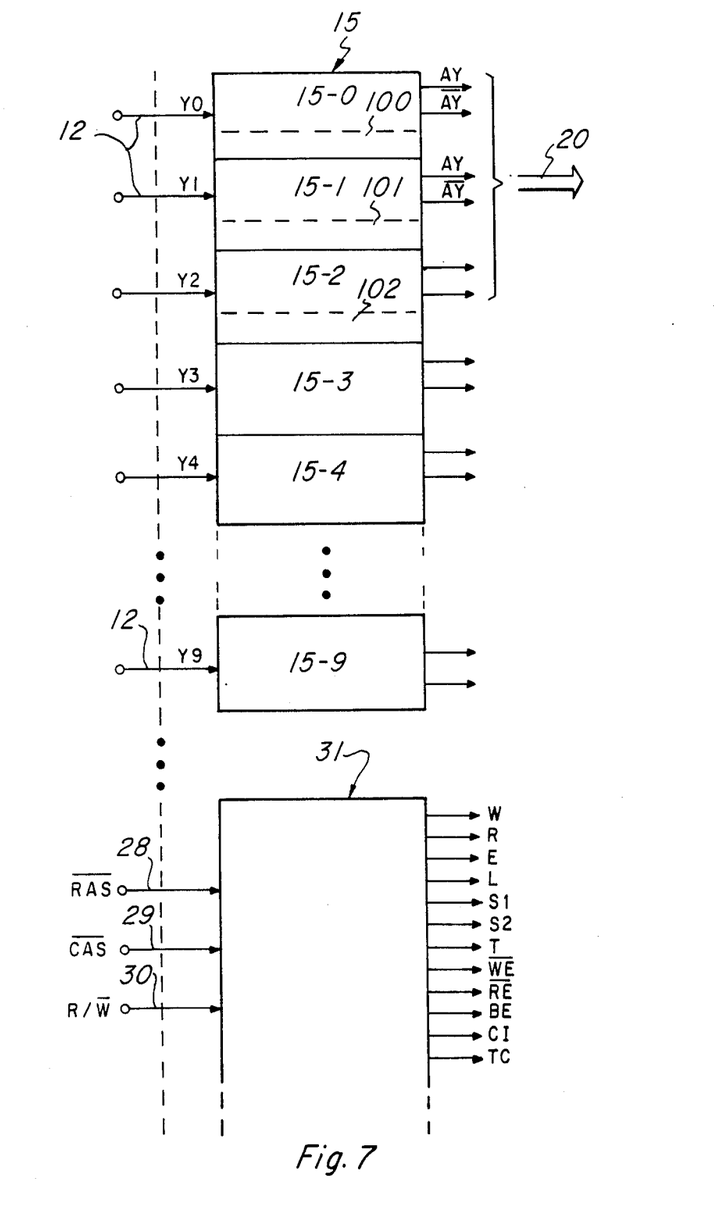
FIG. 7 is a block diagram of the column address buffers of the memory device ofr FIG. 1.

Referring to FIG. 7, the column address buffers 15 are shown in more detail. In this example, the three least significant bits of the buffers 15 contain a three-stage counter according to the invention, consisting of three stages 100, 101, 102. That is, the least significant bit 15-0 of the column buffers has the stage 100 associated with it, the next bit 15-1 has stage 101, and bit 15-2 has stage 102. The bits 15-3 through 15-9 of the column address buffers contain no counter stages in this example embodiment, although if an extended nibble mode (using sixteen, thirty-two, etc., or indeed up to 1024 bits) then more (or all) of the stages of the column address buffer would use the counter circuits. The counter circuits are of simple construction and occupy little space, so the chip may be laid out with all buffer stages having a counter, and only certain ones used—selected by metal mask, as will be explained. Each input buffer stage receives an address bit Y0 . . . Y9 from the input pins 12 and produces Ay and $\overline{Ay}$ outputs on lines 20, 25 and 23 as previously discussed. The clocks and controls for defining the operation of the address counter stages 100, 101 and 102, as well as controlling the buffer stages 15-0 . . . 15-9, are generated in the circuitry 31 from the $\overline{RAS}$, $\overline{CAS}$ and R/$\overline{W}$ inputs; these include a BE signal, a write or read enable EN, and CAS, as will be explained.

Figure 8A:
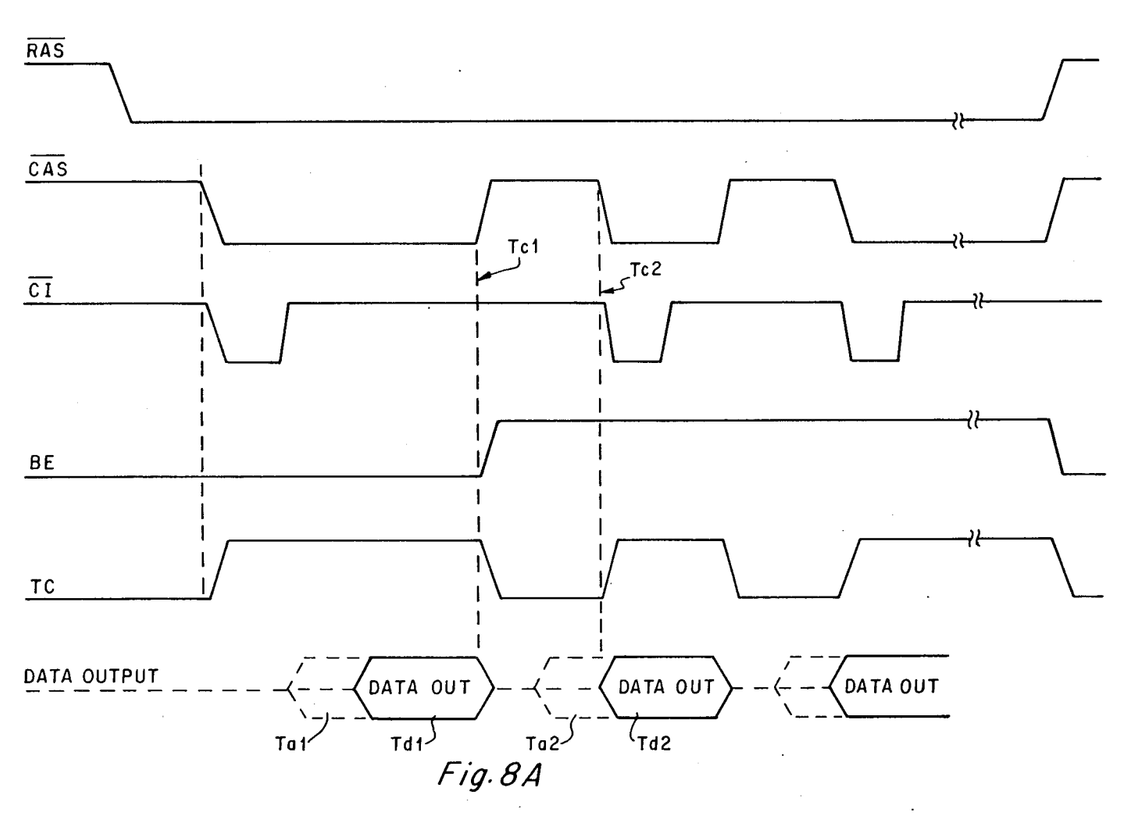
FIG. 8a is a timing diagram showing certain of the control signals used in FIG. 8.
Figure 8B:
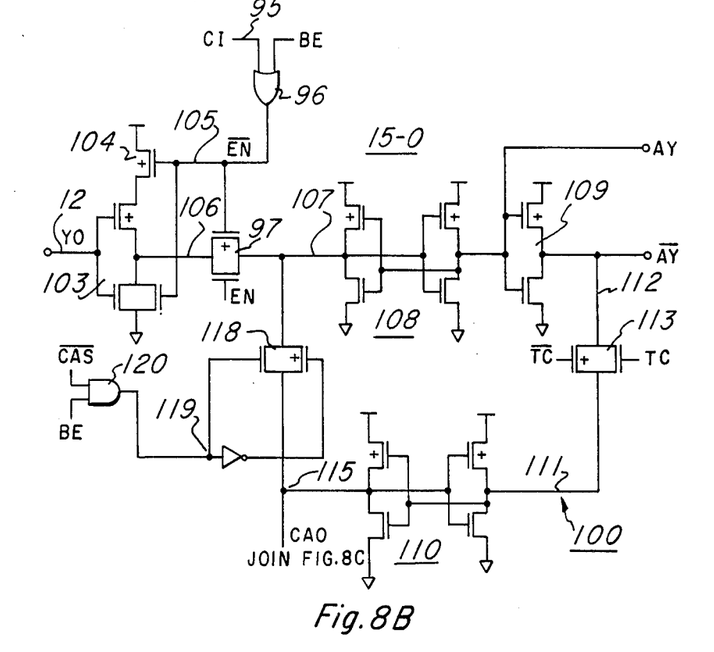
FIG. 8 is an electrical schematic diagram of the address counter for the serial data I/O function in the device of FIGS. 1-5, according to the invention.
Figure 8C:
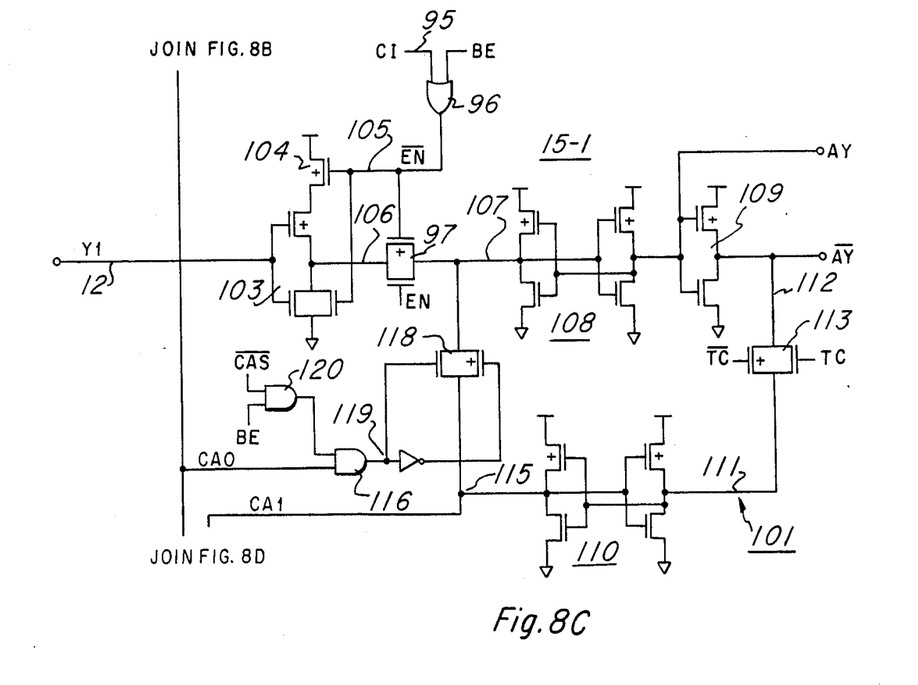
Figure 8D:
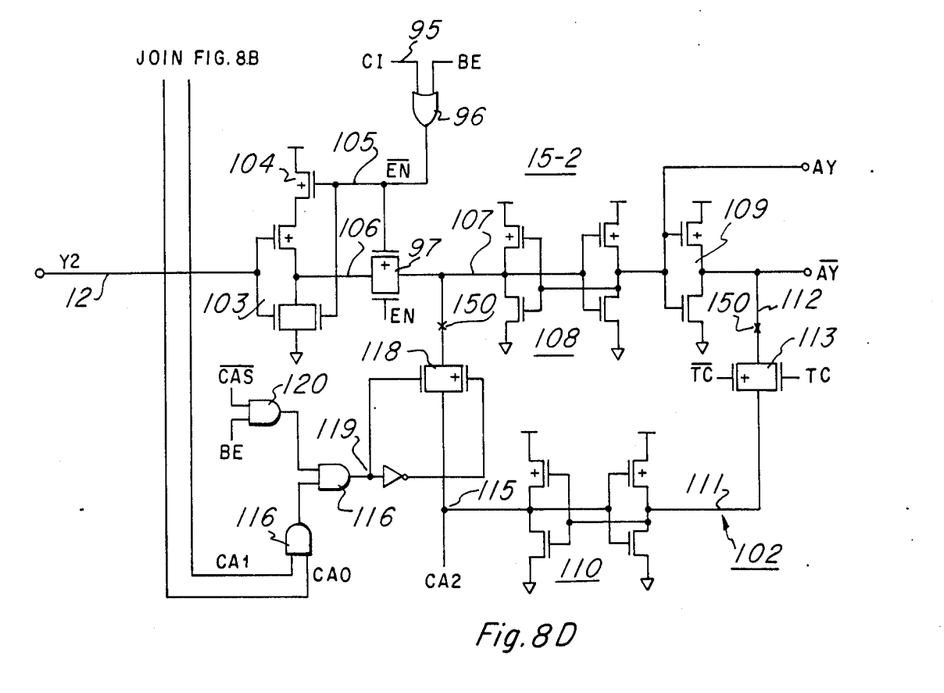

Referring to FIG. 8, and the timing diagram of FIG. 8a, the address buffers 15-0, 15-1 and 15-2 are activated to accept address bits on the pins 12 when a CI control signal is low on a control line 95, at one input of an OR gate 96 for each stage, producing a low voltage as an enable voltage $\overline{EN}$. The control CI goes high at certain delay after $\overline{CAS}$ drops, this delay representing the column address hold time. The address bits existing on the terminals 12 when CI goes high are latched into the column buffers. A CMOS pass gate 97 is shut off in each stage by $\overline{EN}$ going high. The BE signal, as described below, is also an input to OR gates 96 and so shuts off these pass gates. So, once BE goes high as seen in FIG. 8a $\overline{EN}$ will stay high to disable pass gates 97, even though CI still toggles with CAS. When RAS goes high it resets the BE signal.

In FIG. 8, detailed circuits of the three counter stages (for the example) are shown combined with the three LSB's of the Y or column address latches, 15-0, 15-1 and 15-2, according to the invention. The Y address input bits Y0, Y1 and Y2, are applied by the three lines 12 to three essentially identical buffer/latch circuits 15-0, 15-1 and 15-2, and in each of these circuits the address is received by a CMOS input NOR gate 103. This NOR gate 103 is activated only if a P-channel transistor 104 is on, i.e. when the $\overline{EN}$ voltage at a node 105 is low. The output 106 from the NOR gate 103 is connected through a pass gate 97 to the input 107 of a CMOS latch circuit 108, which will hold this Y address bit after $\overline{EN}$ on the control node 105 goes high and disables the pass gate 97 and the input NOR gate 103 (by P-channel transistor 104). An address output stage 109 provides Ay and $\overline{Ay}$ outputs which are applied to the Y address decoder 17 by lines 20. This circuit as thus far described functions for the Y address input bits during normal read/write operations.

The counter portion of each stage 100, 101 and 102 of FIG. 8 includes a CMOS latch 110 having an input 111 driven from the node 112 at the Y address output, through CMOS transfer gate 113. When $\overline{CAS}$ goes low in the beginning of an active cycle, the transfer signal TC goes high (and $\overline{TC}$ goes low), turning on the CMOS gates 113 in all three stages; as seen in FIG. 8a, the TC signal follows CAS, but is the complement of $\overline{CAS}$. This loads the current three LSB's of the column address into the counter latches 110. The output nodes 115 of the first two counter latches produce carry bits CA0 and CA1, which appear as inputs to AND gates 116 of the second two stages. The carry bits ripple forward and the carry gates evaluate and determine which bit should be flipped next in order to implement a binary count (so the ripple decode will look invisible to the next cycle). The first $\overline{CAS}$ cycle produces a data output bit at time Td1 of FIG. 8a, based on the initial column address which propogates through the several column decoders 17, 49 and 56 during the time Ta1 just before Td1. When $\overline{CAS}$ rises at Tc1 ($\overline{RAS}$ still down), the TC signal drops, and whatever address bits existed at the Ay outputs 112 are fixed in latches 110 at the outputs 115; immediately BE goes high and the carry circuits evalute, so a new bit is valid at the inputs 107 of the buffer latches 108 and some will flip, producing a new column address valid on the outputs Ay and $\overline{Ay}$ during th time Ta2; therefore, immediately upon $\overline{CAS}$ dropping at time Tc2 another data bit is valid at Td2 of FIG. 8a.

The counter outputs 115 of FIG. 8 are applied through a second CMOS transfer gate 118 for each stage to the inputs 107 of the latches 108, if the node 119 for the stage is high. The node 119 of each stage is controlled by an AND gate 120, as well as the carry decoder gates 116 of the second two stages. For the first stage 100, the counter will flip the y buffer latch 108 for bit 15-0 every time $\overline{CAS}$ goes high and BE is high at the input of gate 120 (producing a high output at the node 119 and turning on the gate 118). The second counter stage 101 will flip the latch 108 for this bit 15-1 when $\overline{CAS}$ goes high and BE is high, but only if CA0 is high; similarly the third counter stage 102 will flip the latch 108 in bit 15-2 of the y address buffers only if both carry bits CA0 and CA1 are high at the inputs of gate 116.

Figure 9:
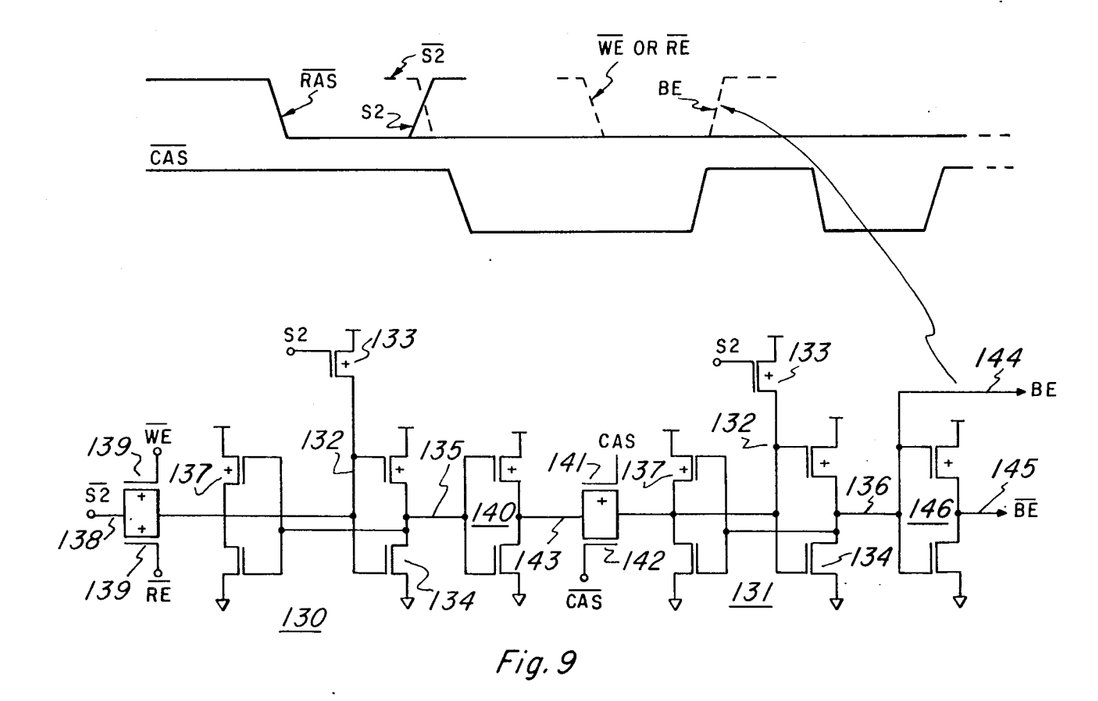
FIG. 9 is an electrical schematic diagram of the clock and control circuitry for the circuit of FIG. 8.

Referring to FIG. 9, a circuit is shown that will detect the end of a first $\overline{CAS}$ cycle within one $\overline{RAS}$ cycle, and generate the byte enable BE signal. This circuit consists of a pair of CMOS latches 130 and 131, each being set in one condition by the sense clock S2 (see FIG. 6) going low in a $\overline{RAS}$ precharge period and driving nodes 132 high through P-channel transistors 133. This turns on N-channel transistors 134, drives output nodes 135 and 136 low, and turns on P-channel transistors 137 which hold the nodes 132 high. This is a precharge condition. The first latch 130 functions to detect the first $\overline{CAS}$ cycle; this is done in response to the sense clock $\overline{S2}$ and the $\overline{WE}$ or $\overline{RE}$ signals. After $\overline{RAS}$ falls and S2 goes high to complete the sense amplifier operation as explained with reference to FIG. 6, S2 goes low on node 138 to allow node 132 of latch 130 to discharge if either $\overline{WE}$ or $\overline{RE}$ is low to turn on either of the transistors 139. The output node 135 of the first latch 130 goes high to indicate that a first $\overline{CAS}$ cycle has been initiated. At this point it is not known whether this will be a normal cycle or a serial mode cycle.

The second latch 131 functions to detect that a serial mode is being signalled. To this end, the output 135 of the first latch is connected through a CMOS inverter 140 and gating transistors 141 and 142 to the node 132 of the second latch 131; the transistors 141 and 142 have the $\overline{CAS}$ and CAS voltage on their gates, so when $\overline{CAS}$ is low the N-channel transistor 142 is off (at this point CAS is high and the P-channel transistor 141 is off). Even with node 143 low the latch 131 remains in its initial state because its node 132 will not be discharged into node 143 with transistors 141, 142 off.

The first latch 130 flips after $\overline{CAS}$ has dropped, one of the $\overline{WE}$ or $\overline{RE}$ signals goes low (neither $\overline{WE}$ or $\overline{RE}$ can drop when $\overline{CAS}$ is high) turning on one of the transistors 139, and $\overline{S2}$ has fallen. This brings the node 135 high and output node 143 low. The second latch will not flip, however, until $\overline{CAS}$ goes back high (while $\overline{RAS}$ is still low), which specifies serial mode; this will turn on the transistors 141 and 142 to flip the second latch and drive node 136 high to generate BE and $\overline{BE}$ at the outputs 144 and 145 for the inverter 146. The BE signal will stay high until $\overline{RAS}$ goes high to terminate the serial mode; $\overline{S2}$ goes low after $\overline{RAS}$ goes high, reseting the latches 130 and 131.

The first half of the circuitry of FIG. 9 functions to detect the first normal $\overline{CAS}$-after-$\overline{RAS}$ cycle, anticipating that a special serial mode may follow, then the second half functions to detect the condition of $\overline{CAS}$ going high while $\overline{RAS}$ is still low, signalling that a serial mode is most likely being signalled (by the system CPU to the memory); a signal BE is generated in this second part to isolate the Y address buffers from the address input pads and use the contents of the counter stages 100-102 to update the latches 108 in the y address buffers. The 3-bit address captured in the counter when CI goes high (after $\overline{CAS}$ initially falls) could be any one of eight values; whereever it starts, it counts up to seven and starts back at zero, one count each time $\overline{CAS}$ cycles high (so long as $\overline{RAS}$ stays down).

In a preferred embodiment, each of the ten stages of the Y address buffer 15 has a counter stage like the stages 100-102 built into it so a wide variety of serial modes is available. These ten stages have carry circuits to provide a ten-bit binary counter, as is well known. If a 4-bit nibble mode serial type of output is desired, then only the two LSB's of the counter are used; the lines connecting the latch 108 to the counter are left out, i.e., severed at the points 150 of FIG. 8, for all stages beyond the second bit. This is accomplished by a very simple change in the metal-level mask in the process, which is used late in the manufacturing sequence. Or, if a thirty-two bit extended nibble mode was desired, then the five LSB's would have operative counter stages (not severed at points 150), and all higher bits wouldn't be used. The economics of manufacture of integrated circuits dictates that a very large number of devices of the exact same construction be built, rather than smaller numbers of several different types of devices. Therefore, it is a great advantage to be able to manufacture all of the slices in exactly the same way up to the point of using the metal mask, yet being able to offer a number of different operating modes. Also, the demand for specific types is not known far in advance, so this method allows the final choice to be delayed as much as possible. If a market develops for a certain type, say 16-bit extended nibble, then these devices can be shipped in a short time, without going through a redesign of the chip, new sets of masks, process check-out, etc.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device comprising:
   an array of rows and columns of storage cells, row addressing means receiving a row address and activating one of said rows of cells in response thereto,
   column addressing means receiving a column address and selecting from said activated row a plurality of columns of cells in response to the column address, to produce column output data,
   and an address counter included in said column addressing means, said address counter receiving selected bits of said column address in response to a control signal to provide a stored address, the address counter including means for incrementing said stored address in response to an address control input, and means responsive to said stored address for connecting said column output data to an output terminal.

2. A device according to claim 1 wherein said row addressing means is responsive to said row address when a row address strobe signal occurs, and said column addressing means is responsive to said column address when a column address strobe signal occurs.

3. A device according to claim 2 wherein said row address strobe signal has an activated condition and an inactivated condition, and wherein said address control input is a change of state of said column address strobe signal occurring when said row address storbe signal is said activated condition.

4. A device according to claim 1 wherein said column addressing means includes:
   a plurality of column address input buffer stages, one buffer stage for each bit of said column address,
   a plurality of column address latches, one for each stage of the buffer stages, each address latch having an input receiving an output of the buffer stage, the outputs of all of the address latch being coupled to column decoder means.

5. A device according to claim 4 wherein said address counter includes a plurality of counter stages, each counter stage having an input coupled to the output of one of said address latches and having an output coupled to the input of the one of said address latches.

6. A device according to claim 5 wherein each counter stage includes a counter latch and a carry circuit.

7. A device according to claim 6 wherein address bits propagate through said counter latch and carry circuit prior to occurrence of said address control input.

8. A device according to claim 5 wherein said row addressing means is responsive to said row address when a row address strobe signal occurs, and said column addressing means is responsive to said column address when a column address strobe signal occurs.

9. A device according to claim 8 wherein said row address strobe signal has an activated condition and an inactivated condition, and wherein said control input is a change of state of said column address strobe signals occurring when said row address strobe signal is said activated condition.

10. A device according to claim 1 wherein said memory device is a dynamic read/write memory, and said column addressing means produces column input and output data.

11. A method of addressing a semiconductor memory device containing an array of rows and columns of memory cells, comprising the steps of:

applying a row address to addressing means for the array at the time as a row address strobe is applied to said device, to select a row of the array for data input/output, applying a column address having a plurality of bits to column selector means for the array at the same time as a column address strobe is applied to said device, to select a plurality of columns from said selected row, while at the same time loading part of said bits of said column address into a counter register, said selected plurality of columns being available for data input/output, cycling said column address strobe between active and non-active conditions, and incrementing said counter register when said column address strobe is cycled between said conditions, coupling a selected one of said plurality of columns to an input/output terminal of the device in response to the contents of the counter register, during each cycle of the column address.

12. A method according to claim 11 wherein the step of cycling said column address strobe occurs when said row address strobe is continuously activated.

13. A method according to claim 11 wherein said memory cells are read/write memory cells, and said data output includes paths for both data input and data output.

14. A method according to claim 13 wherein said memory cells are dynamic cells.

15. A semiconductor dynamic read/write memory device comprising:
  an array of rows and columns of one-transistor dynamic storage cells,
  a differential sense amplifier for each column,
  row addressing means for activating one of said rows of storage cells at a first time in an operating cycle,
  means for activating said sense amplifiers for a sense period beginning at said first time in an operating cycle,
  column addressing means for selecting a plurality of said columns for data input or output in response to part of a multi-bit column address,
  a counter register loaded with a different part of said column address for selecting one of said plurality of columns for data input or output, and
  means for incrementing said counter register.

16. A device according to claim 15 wherein said row addressing means includes a row address decoder producing a row address voltage only if a row address strobe is applied.

17. A device according to claim 16 wherein said column addressing means includes a plurality of column address buffers activated only if a column address strobe is applied to the device.

18. A device according to claim 17 wherein said means for incrementing is operated in response to toggling said column address strobe while said row address strobe is active.

* * * * *